US012764849B2

(12) United States Patent
Seelinger

(10) Patent No.: US 12,764,849 B2
(45) Date of Patent: Oct. 13, 2026

(54) ACOUSTIC XENON DROPLET GENERATOR

(71) Applicant: KLA Corporation, Milpitas, CA (US)

(72) Inventor: Sherman Seelinger, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 282 days.

(21) Appl. No.: 18/743,017

(22) Filed: Jun. 13, 2024

(65) Prior Publication Data

US 2024/0431012 A1 Dec. 26, 2024

Related U.S. Application Data

(60) Provisional application No. 63/522,416, filed on Jun. 22, 2023.

(51) Int. Cl.
*H05G 2/00* (2006.01)
*G03F 7/00* (2006.01)

(52) U.S. Cl.
CPC ......... *H05G 2/008* (2013.01); *G03F 7/70033* (2013.01)

(58) Field of Classification Search
CPC ............................ H05G 2/008; G03F 7/70033
See application file for complete search history.

(56) References Cited

U.S. PATENT DOCUMENTS

| | | | | |
|---|---|---|---|---|
| 5,565,113 | A * | 10/1996 | Hadimioglu | B41J 2/14008 216/33 |
| 6,324,256 | B1 * | 11/2001 | McGregor | H05G 2/0023 378/119 |
| 6,647,088 | B1 * | 11/2003 | Schmidt | H05G 2/0023 378/34 |
| 9,295,147 | B2 * | 3/2016 | Bykanov | H05G 2/0086 |
| 11,343,899 | B2 | 5/2022 | Ahr et al. | |
| 2003/0223542 | A1 * | 12/2003 | Shields | H05G 2/0084 378/119 |
| 2003/0223546 | A1 * | 12/2003 | McGregor | H05G 2/0023 378/143 |
| 2004/0129896 | A1 | 7/2004 | Schmidt et al. | |
| 2006/0078017 | A1 * | 4/2006 | Endo | G03F 7/70033 372/38.02 |
| 2006/0192154 | A1 * | 8/2006 | Algots | H05G 2/0023 250/504 R |

(Continued)

FOREIGN PATENT DOCUMENTS

| | | | | |
|---|---|---|---|---|
| EP | 1182912 | A1 * | 2/2002 | H05G 2/003 |
| EP | 1367441 | A2 * | 12/2003 | H05G 2/0023 |

(Continued)

OTHER PUBLICATIONS

PCT/US2024/034571, International Search Report, Oct. 7, 2024.

(Continued)

*Primary Examiner* — David A Vanore
(74) *Attorney, Agent, or Firm* — Hodgson Russ LLP

(57) ABSTRACT

A cup to hold liquid Xe is disposed in a vacuum chamber. The cup has an open top. A piezoelectric transducer is disposed in the cup to generate acoustic waves through the (Continued)

liquid Xe in the cup. The acoustic waves create liquid Xe droplets that fly out of the cup. A laser may generate laser-beam pulses, which are focused by optics onto respective liquid Xe droplets that have flown out of the cup, to generate EUV light.

20 Claims, 8 Drawing Sheets

(56) References Cited

U.S. PATENT DOCUMENTS

| | | | | |
|---|---|---|---|---|
| 2006/0193997 | A1* | 8/2006 | Bykanov | C23C 4/123 118/720 |
| 2008/0210889 | A1* | 9/2008 | Suganuma | G03F 7/70033 250/504 R |
| 2009/0272919 | A1* | 11/2009 | Abe | H05G 2/0023 250/504 R |
| 2012/0280149 | A1 | 11/2012 | Mestrom et al. | |
| 2015/0367448 | A1* | 12/2015 | Buller | H05B 6/68 219/74 |
| 2016/0366756 | A1* | 12/2016 | Wu | G03F 7/70033 |
| 2017/0332467 | A1 | 11/2017 | Sanders et al. | |
| 2018/0157179 | A1* | 6/2018 | Wu | G03F 7/70033 |
| 2019/0150266 | A1 | 5/2019 | Lai et al. | |
| 2021/0310717 | A1 | 10/2021 | Seelinger et al. | |
| 2023/0171869 | A1* | 6/2023 | Sams | H05G 2/0023 355/67 |
| 2023/0280656 | A1* | 9/2023 | Frank | G03F 7/70841 250/504 R |
| 2024/0431012 | A1* | 12/2024 | Seelinger | H05G 2/008 |

FOREIGN PATENT DOCUMENTS

| | | | | | |
|---|---|---|---|---|---|
| EP | 1367866 | A1 | * | 12/2003 | H05G 2/0084 |
| EP | 1367441 | B1 | * | 8/2013 | H05G 2/0023 |
| JP | 2000025321 | A | * | 1/2000 | |
| JP | 2008221187 | A | * | 9/2008 | |
| JP | 4874409 | B2 | * | 2/2012 | H05G 2/0084 |
| JP | 5431675 | B2 | * | 3/2014 | H05G 2/0088 |
| KR | 20120112521 | A | | 10/2012 | |
| KR | 20250100188 | A | * | 7/2025 | G03F 7/70916 |
| WO | 2016146400 | A1 | | 9/2016 | |

OTHER PUBLICATIONS

PCT/US2024/034571, Written Opinion of the International Searching Authority, Oct. 7, 2024.

B. Hadimioglu et al., “Moving Liquids with Sound: The Physics of Acoustic Droplet Ejection for Robust Laboratory Automation in Life Sciences,” Journal of Laboratory Automation, vol. 21, Issue 1, pp. 4-18, Feb. 2016.

Labcyte Inc., “Echo(r) Liquid Handlers: Brochure,” Version 3.0, Jan. 2019.

* cited by examiner

ACOUSTIC XENON DROPLET GENERATOR

RELATED APPLICATION

This application claims the benefit of U.S. Provisional Patent Application No. 63/522,416, filed on Jun. 22, 2023, which is incorporated by reference in its entirety for all purposes.

TECHNICAL FIELD

This disclosure relates to extreme ultraviolet (EUV) light sources, and more specifically to creating Xenon (Xe) droplets in a vacuum.

BACKGROUND

EUV light sources, which typically produce light with a wavelength of 13.5 nm, are used in semiconductor manufacturing equipment. EUV light sources may operate by spraying Xenon (Xe) gas onto the outside surface of a spinning drum that is cooled with liquid nitrogen. Nitrogen gas produced by cooling the drum is exhausted from the drum while the drum spins. The Xe freezes on the outside surface of the drum, resulting in the formation of Xe ice on the outside surface of the drum. A diamond cutter blade shaves down the Xe ice to level it out. An infrared laser beam is focused on the Xe ice surface, sparking a plasma that emits EUV light, including 13.5 nm light. Such light sources, while effective, are complex, heavy, and expensive.

SUMMARY

Accordingly, there is a need for simpler EUV light sources.

In some embodiments, an apparatus includes a vacuum chamber and a cup, disposed in the vacuum chamber, to hold liquid Xe. The cup has an open top. The apparatus also includes a piezoelectric transducer, disposed in the cup, to generate acoustic waves through the liquid Xe in the cup. The acoustic waves are to create liquid Xe droplets that fly out of the cup. The apparatus may further include a laser to generate laser-beam pulses and optics to focus the laser-beam pulses onto respective liquid Xe droplets that have flown out of the cup, to generate EUV light.

In some embodiments, a method includes producing a vacuum in a vacuum chamber. With the vacuum in the vacuum chamber, liquid Xe is held in a cup with an open top. The cup is disposed in the vacuum chamber. Also with the vacuum in the vacuum chamber, acoustic waves are generated through the liquid Xe in the cup, using a piezoelectric transducer disposed in the cup. The acoustic waves create liquid Xe droplets that fly out of the cup. The method may further include generating laser-beam pulses and focusing the laser-beam pulses onto respective liquid Xe droplets that have flown out of the cup, to generate EUV light.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1A:
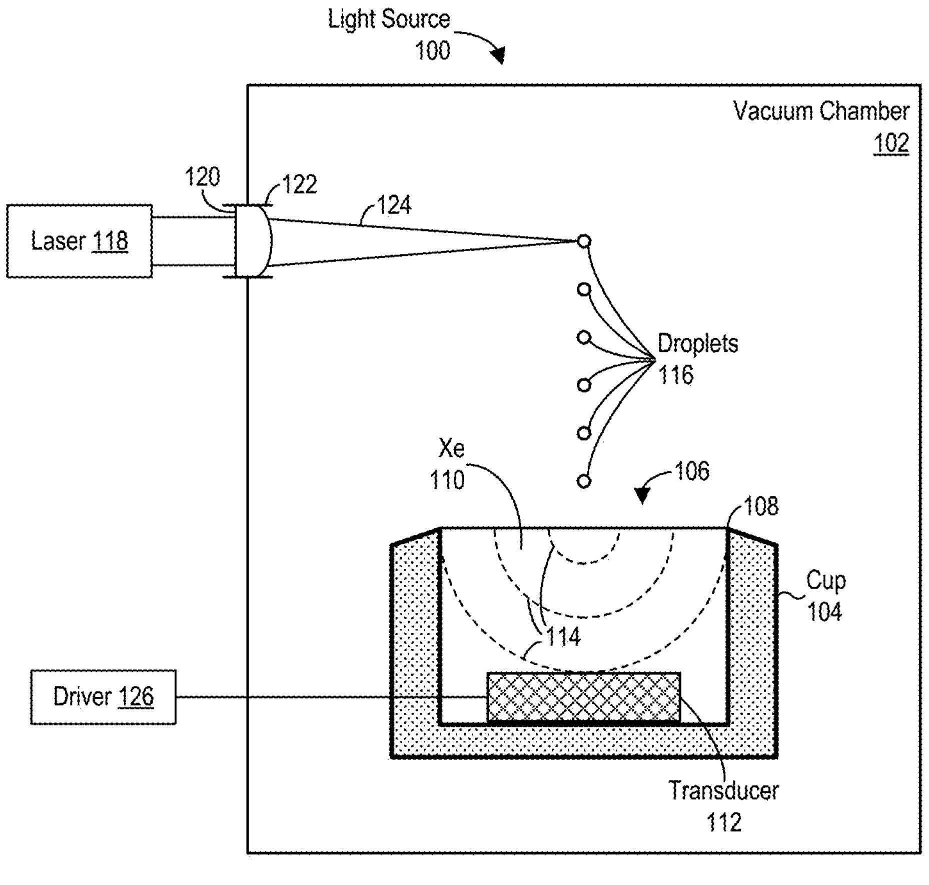
FIGS. 1A-1C are cross-sectional views showing an EUV light source in accordance with some embodiments.
Figure 1B:
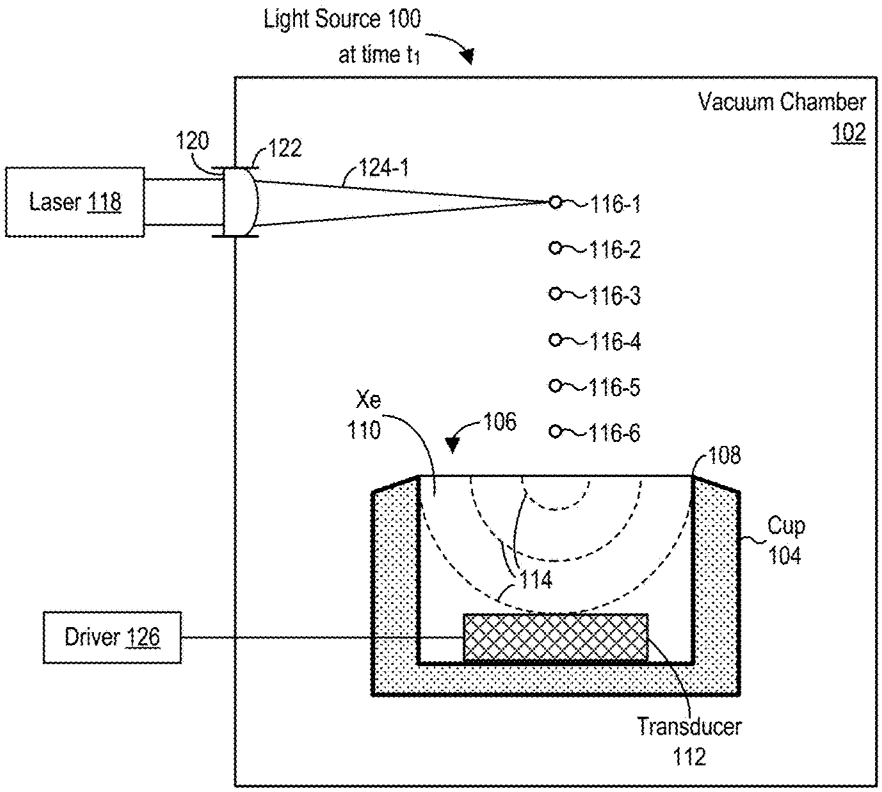
Figure 1C:
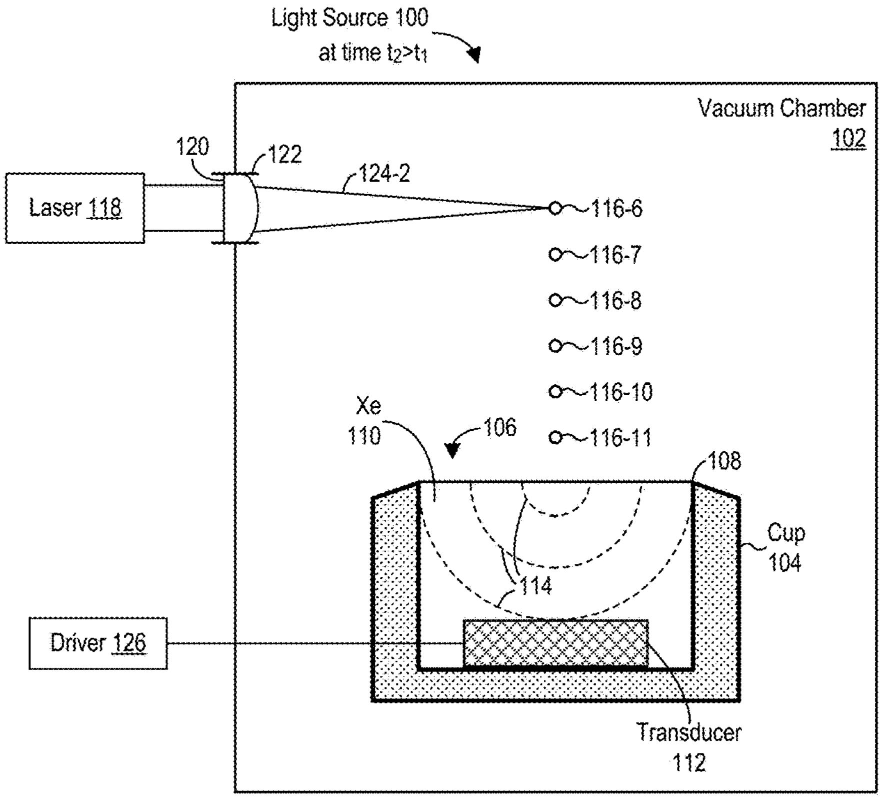

FIGS. 1A-1C are cross-sectional views showing an EUV light source 100 in accordance with some embodiments. The EUV light source 100 includes a vacuum chamber 102. A vacuum is produced and maintained in the vacuum chamber 102 using one or more vacuum pumps (e.g., turbo pumps) (not shown). A cup 104 with an open top 106 is disposed in the vacuum chamber 102. The cup 104 holds liquid Xe 110. For example, the cup 104 is filled to the open top 106 with the liquid Xe 110. In some embodiments, the cup 104 is round. For example, the cup 104 has a diameter (e.g., an inner diameter) of approximately 10 mm (e.g., to within 10% of 10 mm, such that the diameter is in a range between 9-11 mm) and a depth of approximately 10 mm (e.g., to within 10% of 10 mm, such that the depth is in a range between 9-11 mm).

A piezoelectric transducer 112 is disposed in the cup 104. For example, the piezoelectric transducer 112 is disposed at the bottom of the cup 104. The piezoelectric transducer 112 generates acoustic waves 114 that travel through the liquid Xe 110 in the cup 104. The acoustic waves 114 are focused on a point at the surface of the liquid Xe 110. This point is the focal point of the piezoelectric transducer 112. The acoustic waves 114 create droplets 116 of liquid Xe, which fly out of the cup 104 (i.e., out of the open top 106 of the cup 104). In some embodiments, the liquid Xe droplets 116 have a diameter of approximately 100 um (e.g., to within 5% or 10%). By having the liquid Xe droplets 116 fly out of the open top 106 of the cup 104, the EUV light source 100 avoids the use of a nozzle to dispense the liquid Xe droplets 116.

The piezoelectric transducer 112 is driven by a piezo driver 126, to which the piezoelectric transducer 112 is electrically connected. The piezo driver 126 repeatedly provides a voltage to the piezoelectric transducer 112, causing the piezoelectric transducer 112 to expand and thus to generate an acoustic wave 114. The piezo driver 126 may provide the voltage to the piezoelectric transducer 112 at a regular frequency (i.e., periodically), such that the acoustic waves 114 are generated at this frequency and the liquid Xe droplets 116 are created at this frequency. In some embodiments, the frequency is on the scale of kilohertz or tens of kilohertz. For example, the frequency is in the range of 5-15 kHz.

The EUV light source 100 further includes a laser 118 (e.g., an infrared laser) that generates laser-beam pulses 124 (e.g., infrared laser-beam pulses). Optics, including for example an objective 120 (i.e., an objective lens), focus the laser-beam pulses 124 onto respective liquid Xe droplets 116. In some embodiments, the objective 120 is disposed in a port 122 in a wall of the vacuum chamber 102, with the laser-beam pulses 124 being introduced into the vacuum chamber 102 through the objective 120. When a laser-beam pulse 124 hits a respective liquid Xe droplet 116, it causes the liquid Xe droplet 116 to explode, sparking a plasma. The plasma emits EUV light, including 13.5 nm light. The vacuum chamber 102 may further include collection mirrors (not shown) that collect the EUV light and ports through which the collected EUV light exits the vacuum chamber 102. EUV optics outside of the vacuum chamber 102 (not shown) direct the collected EUV light to a target. In some embodiments, the distance from the open top 106 of the cup 104 and the point at which laser-beam pulses hit respective liquid Xe droplets 116 is in the range of 5-6 inches.

The explosion caused by a laser-beam pulse 124 hitting a respective liquid Xe droplet 116 generates a shockwave that may disturb the trajectory of subsequent liquid Xe droplets 116 (i.e., droplets 116 below the exploding droplet 116) and roil the surface of the liquid Xe 110 in the cup 104. These effects may prevent subsequent liquid Xe droplets 116 from passing through the point of focus of the laser-beam pulses 124. The effects of the shockwave may be allowed to die out before hitting another liquid Xe droplet 116 with a respective laser-beam pulse 124. To allow the effects of the shockwave to die out, one or more liquid Xe droplets 116 may be allowed to pass without being hit by corresponding laser-beam pulses 124 (i.e., without corresponding laser-beam pulses 124 being generated and focused on them). Only every nth liquid Xe droplet 116 thus may have a respective laser-beam pulse 124 focused on it, where n is an integer greater than one, in accordance with some embodiments. Accordingly, the laser 118 may generate the laser-beam pulses 124 with a timing that causes successive respective liquid Xe droplets 116 onto which the laser-beam pulses 124 are focused to be separated by a specified number of liquid Xe droplets 116 from the cup 104 that are not illuminated by (i.e., hit by) the laser-beam pulses 124. The frequency with which the laser-beam pulses 124 are generated and focused onto respective liquid Xe droplets 116 therefore may be 1/n times the frequency at which liquid Xe droplets 116 are created. This approach helps to ensure that liquid Xe droplets 116 are hit by the laser-beam pulses 124 in a reliable, repeatable manner.

FIGS. 1B and 1C show an example in which every fifth liquid Xe droplet 116 is hit by a laser-beam pulse 124 (i.e., n equals 5). FIG. 1C shows the same light source 100 as FIG. 1B but at a later point in time than in FIG. 1B. In FIG. 1B, a first liquid Xe droplet 116-1 is hit by a first laser-beam pulse 124-1. Second, third, fourth, and fifth liquid Xe droplets 116-2, 116-3, 116-4, and 116-5 are subsequently not hit by laser-beam pulses 124. A sixth liquid Xe droplet 116-6 is then hit by a second laser-beam pulse 124-2, as shown in FIG. 1C. Next, seventh, eighth, ninth, and tenth liquid Xe droplets 116-7, 116-8, 116-9, and 116-10 are not hit by laser-beam pulses 124. An eleventh liquid Xe droplet 116-11 would then be hit by a third laser-beam pulse 124 (not shown), and so on. In the example of FIGS. 1B and 1C, if the liquid Xe droplets 116 are created at a frequency of 5-15 kHz, then the laser-beam pulses 124 are generated and focused onto respective liquid Xe droplets 116 at a frequency of 1-5 kHz.

Figure 2:
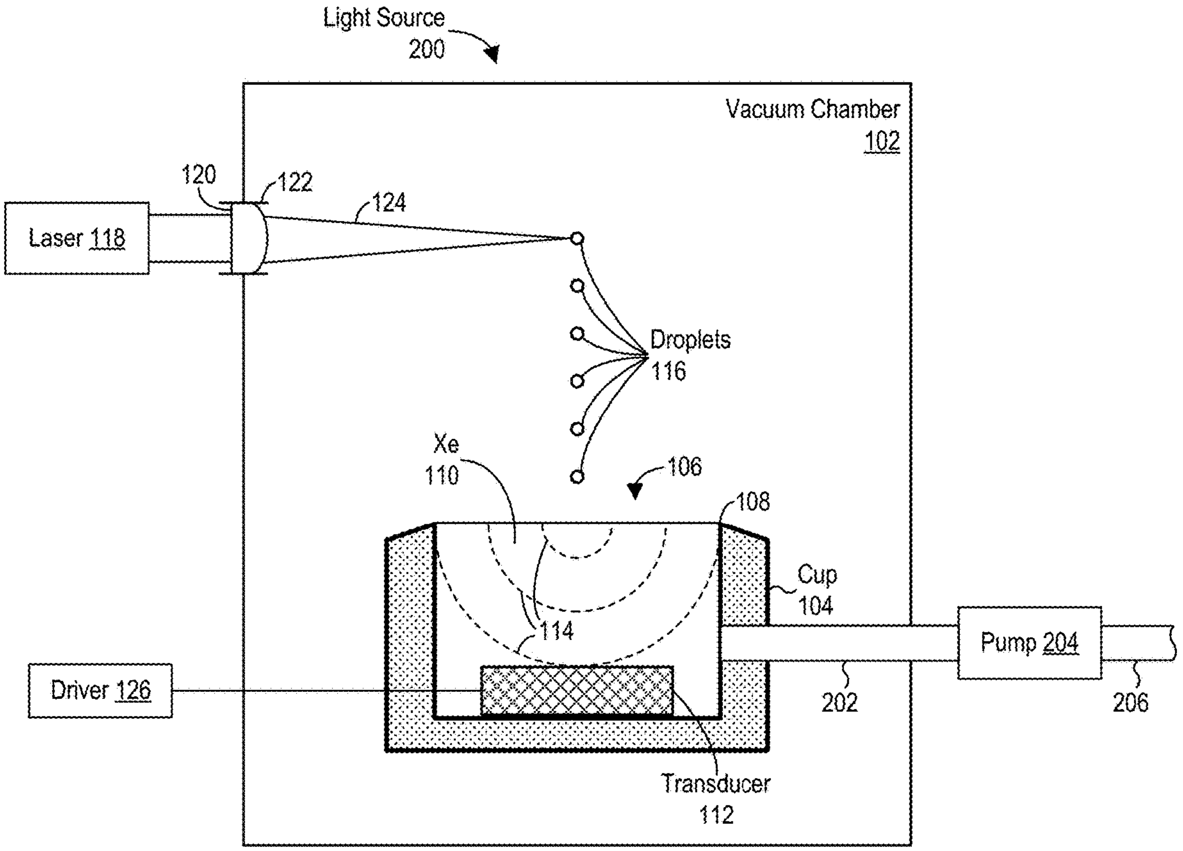
FIG. 2 is a cross-sectional view of an EUV light source that includes a pump that pumps liquid Xe to the cup of the EUV light source of FIGS. 1A-1C in accordance with some embodiments.

FIG. 2 shows an EUV light source 200 in accordance with some embodiments. The EUV light source 200 is an example of the EUV light source 100 (FIGS. 1A-1C) that further includes a pump 204 (e.g., a cryogenic pump, which may be a diaphragm pump) to pump the liquid Xe 110 into the cup 104 through a tube 202. The tube 202 is mechanically coupled between the pump 204 and the cup 104, to provide the liquid Xe 110 from the pump 204 to the cup 104. In the example of FIG. 2, the pump 204 is disposed outside of the vacuum chamber 102 and the tube 202 passes through a wall of the vacuum chamber 102. Alternatively, the pump 204 may be disposed inside the vacuum chamber 102. The pump 204 receives liquid Xe 110 to pump to the cup 104 through a supply line 206.

In some embodiments, the open top 106 of the cup 104 has sharp edges 108. (The plural term edges as used herein may refer to a single edge, if, for example, the cup 104 is round or has another shape without corners such that there is only one edge 108.) The pump 204 may be configured to provide the liquid Xe 110 to the cup 104 at a rate (e.g., a constant rate) sufficient to cause the liquid Xe 110 to continuously overflow the top of the cup 204, over the sharp edges 108. By having the liquid Xe 110 continuously overflow the top of the cup 104, the liquid Xe 110 is held at a constant height in the cup 104. Holding the liquid Xe 110 at a constant height helps to ensure that the liquid Xe droplets 116 are created in a repeatable manner.

Figure 3:
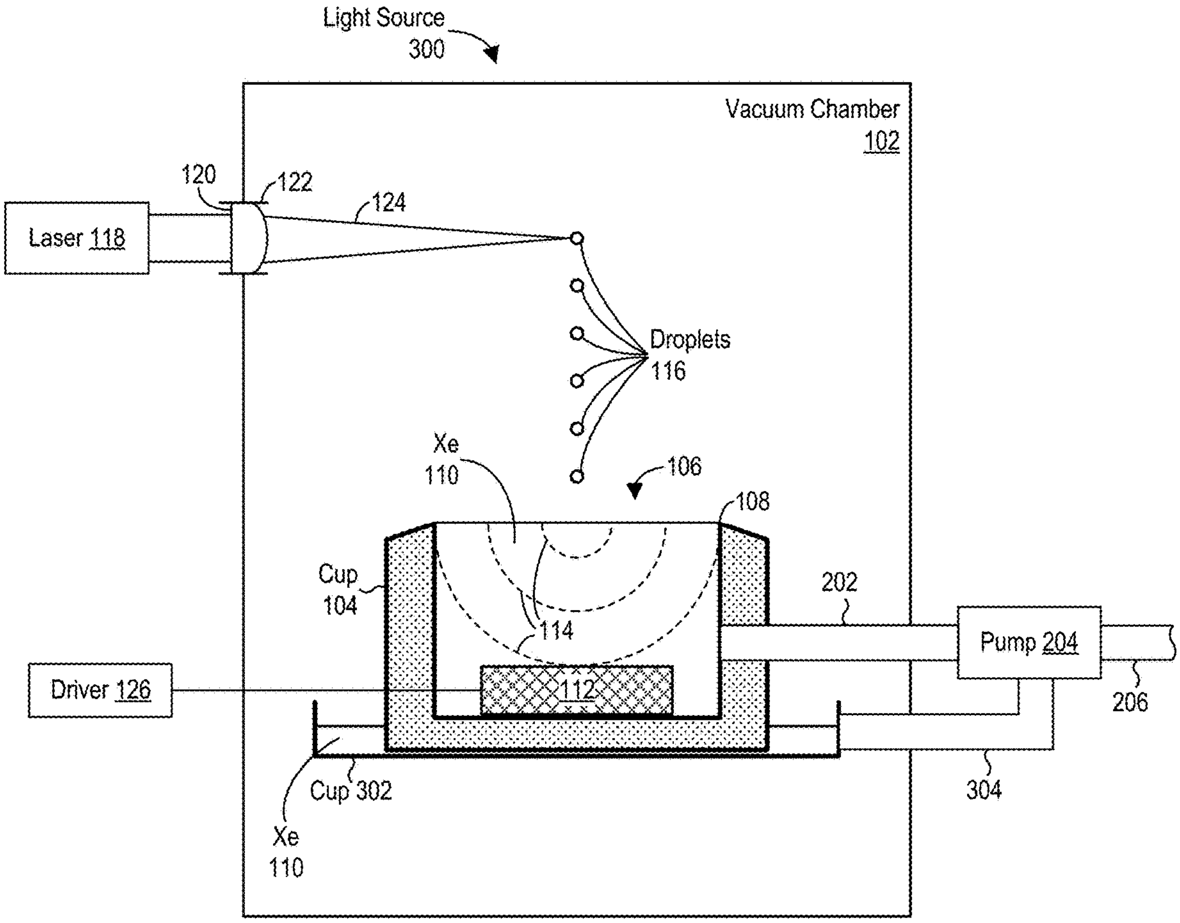
FIG. 3 is a cross-sectional view of an EUV light source that includes a second cup disposed beneath the cup of the EUV light source of FIG. 2 and coupled to the pump of the EUV light source of FIG. 2 in accordance with some embodiments.

FIG. 3 shows an EUV light source 300 in accordance with some embodiments. The EUV light source 300 is an example of the EUV light source 200 (FIG. 2), and thus an example of the EUV light source 100 (FIGS. 1A-1C), that further includes a second cup 302 disposed beneath the cup 104 (the cup 104 being a first cup) in the vacuum chamber 102. The second cup 302, which is wider than the first cup 104, serves as a saucer for the first cup 104: the second cup 302 collects the liquid Xe 110 that overflows the first cup 104. The collected liquid Xe 110 is recirculated back to the first cup 104: a second tube 304 (the tube 202 being a first tube) is coupled between the second cup 302 and the pump 204 to provide the collected liquid Xe 110 from the second cup 302 to the pump 204. The pump 204 pumps the liquid Xe 110 back to the first cup 104.

FIG. 3 shows the supply line 206 to provide liquid Xe 110 to the cup 104. But in some embodiments the supply line 206 is omitted, with recirculation of the liquid Xe 110 being sufficient to maintain the height of the liquid Xe 110 at a constant level at the open top 106 of the cup 104.

In the examples of FIGS. 1A-1C, 2, and 3, the liquid Xe droplets 116 fly vertically out of the cup 104, in a direction perpendicular to the open top 106 of the cup 104. (The open top 106 is horizontal in these figures.) But the direction in which the liquid Xe droplets 116 fly out of the cup 104 may be varied. In some embodiments, the piezoelectric transducer 112 has variable timing, allowing the frequency at which the piezoelectric transducer 112 generates acoustic waves 114 to be adjusted. The direction in which the liquid Xe droplets 116 fly out of the cup 104 is controlled by adjusting this timing to cause creation of the liquid Xe droplets 116 to interact with waves on the surface of the liquid Xe 110.

Figure 4:
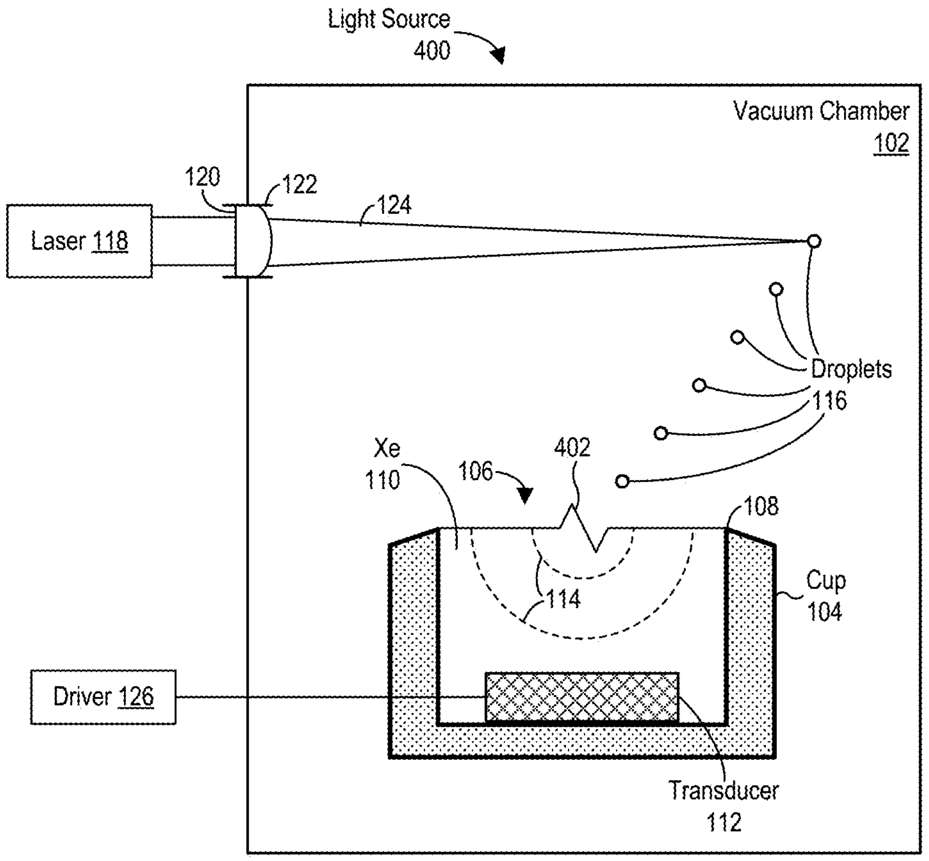
FIG. 4 is a cross-sectional view of an EUV light source in which the piezoelectric transducer has variable timing for controlling the direction in which the liquid Xe droplets fly out of the cup, in accordance with some embodiments.

FIG. 4 is a cross-sectional view of an EUV light source 400 that is an example of the EUV light source 100 (FIGS. 1A-1C) in which the piezoelectric transducer 112 has variable timing for controlling the direction in which the liquid Xe droplets 116 fly out of the cup 104, in accordance with some embodiments. While the light source 400 is shown as an example of the EUV light source 100, it may also be an example of the EUV light source 200 (FIG. 2) and/or 300 (FIG. 3). The timing of the piezoelectric transducer 112 may be varied by varying the frequency at which the piezo driver 126 provides a voltage to the piezoelectric transducer 112.

Creation of a liquid Xe droplet 116 (i.e., emission of a liquid Xe droplet 116 from the cup 104) creates waves on the surface of the liquid Xe 110, such as a wave 402. If the wave 402 is situated at or near the focal point of the piezoelectric transducer 112 when an acoustic wave 114 reaches the focal point, the wave 402 will cause the liquid Xe droplet 116 to fly out of the cup 104 in a non-vertical direction. This non-vertical direction is at an acute angle to the open top 106 of the cup 104 (with the open top 106 being horizontal in FIG. 4). In some embodiments, this angle is sufficiently acute such that a liquid Xe droplet 116 is no longer over the cup 104, but instead is to the side of the cup 104, when the liquid Xe droplet 116 is hit by a respective laser-beam pulse 124, as shown in FIG. 4. Directing the liquid Xe droplet 116 such that it is no longer over the cup 104 when it is hit by the laser-beam pulse 124 reduces or eliminates the effect of the resulting shockwave on the surface of the liquid Xe 110 in the cup 104.

Figure 5:
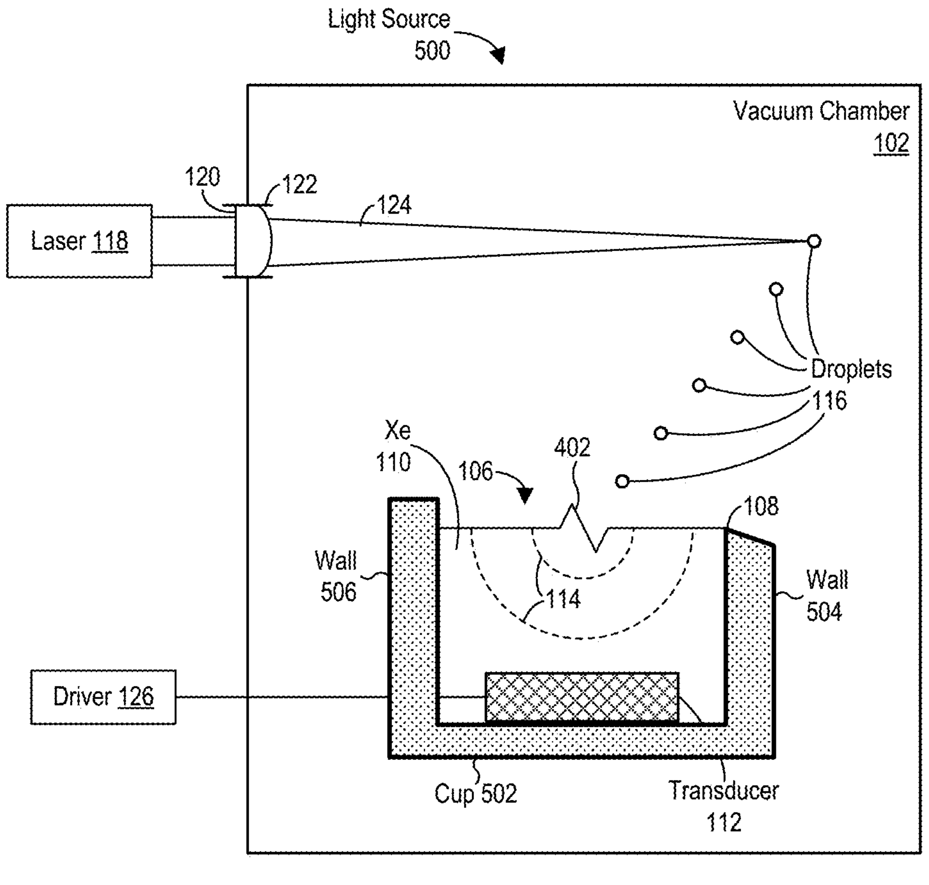
FIG. 5 is a cross-sectional view of an EUV light source in which a cup holding liquid Xe has a first wall (or first wall portion) that is higher than a second wall (or second wall portion), in accordance with some embodiments.

In some embodiments, the direction and/or shape of the waves, including the wave 402, are controlled at least in part through the design of the cup. FIG. 5 is a cross-sectional view of an EUV light source 500 in which the cup 104 is replaced with a cup 502. The cup 502 has a first wall (or first portion of a wall) 506 that is higher than a second wall (or second portion of the wall) 504, in accordance with some embodiments. The height of the first wall (or wall portion) 506, and the difference between the height of the first wall (or wall portion) 506 and the height of the second wall (or wall portion) 504, are selected to provide waves that cause the liquid Xe droplets 116 to be directed in a desired direction.

The second wall (or second wall portion) 504 may have a sharp edge 108. The liquid Xe 110 in the cup 502 may continuously overflow the sharp edge 108. The first wall (or first wall portion) 506 may or may not have a sharp edge. The liquid Xe 110 in the cup 502 does not overflow the top of the first wall (or first wall portion) 506.

The light source 500 is an alternative to the light source 400 (FIG. 4). The cup 502 may be a first cup. The light source 500 may include additional components beyond those shown in FIG. 5, including for example the first tube 202 (FIGS. 2-3), pump 204 (FIGS. 2-3), supply line 206 (FIGS. 2-3), second cup 302 (FIG. 3), and/or second tube 304 (FIG. 3).

Figure 6:
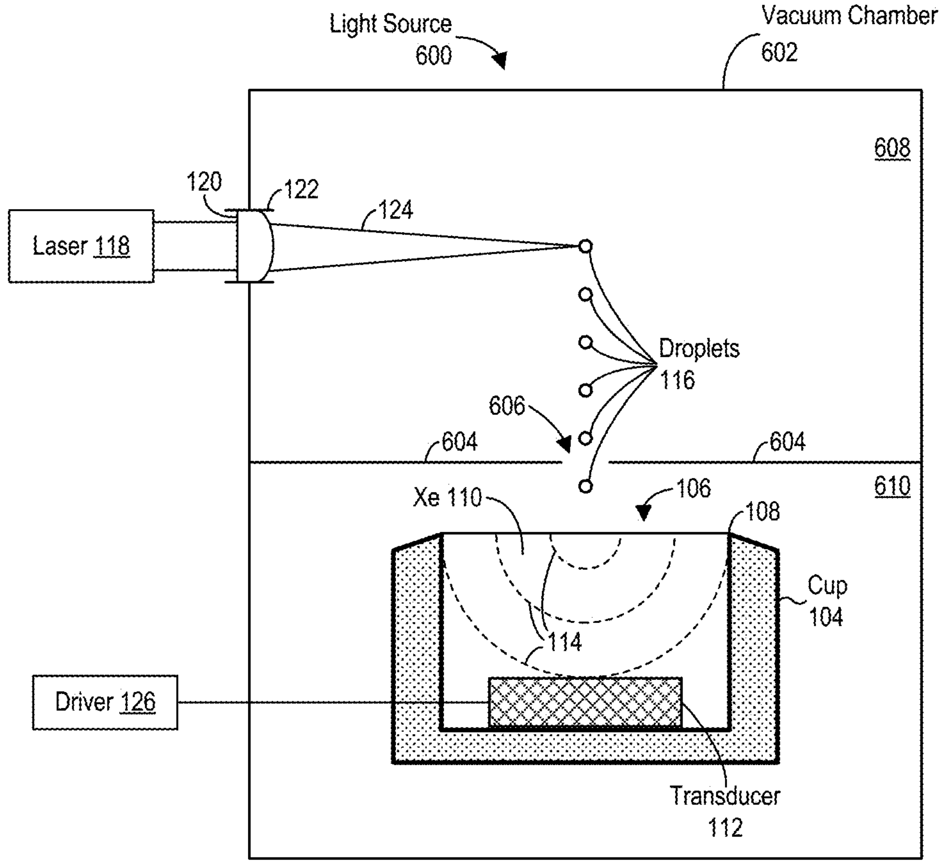
FIG. 6 is a cross-sectional view of an EUV light source in which one or more baffles divide the vacuum chamber into two vacuum zones, in accordance with some embodiments.

FIG. 6 is a cross-sectional view of an EUV light source 600 with a vacuum chamber 602, in accordance with some embodiments. The EUV light source 600 and the vacuum chamber 602 are respective examples of the EUV light source 100 and the vacuum chamber 102 (FIGS. 1A-1C). The EUV light source 600 may be an example of the EUV light sources 200, 300, and/or 400 (FIGS. 2-4). The cup 104 in the EUV light source 600 may be replaced with the cup 504 (FIG. 5), with the EUV light source 600 then being an example of the EUV light source 500 (FIG. 5).

The vacuum chamber 602 includes one or more baffles 604 that separate a first vacuum zone 608 of the vacuum chamber 602 from a second vacuum zone 610 of the vacuum chamber 602. The first and second vacuum zones 608 and 610 may be separately pumped using respective vacuum pumps. The cup 104 is disposed in the second vacuum zone 610. Liquid Xe droplets 116 from the cup 104 pass through an aperture 606 in the one or more baffles 604 into the first vacuum zone 608, where at least some of the liquid Xe droplets 116 (e.g., every nth liquid Xe droplet 116) are hit by respective laser-beam pulses 124. The one or more baffles 604 protect the surface of the liquid Xe 110 in the cup 104 from the resulting shockwaves.

Figure 7:
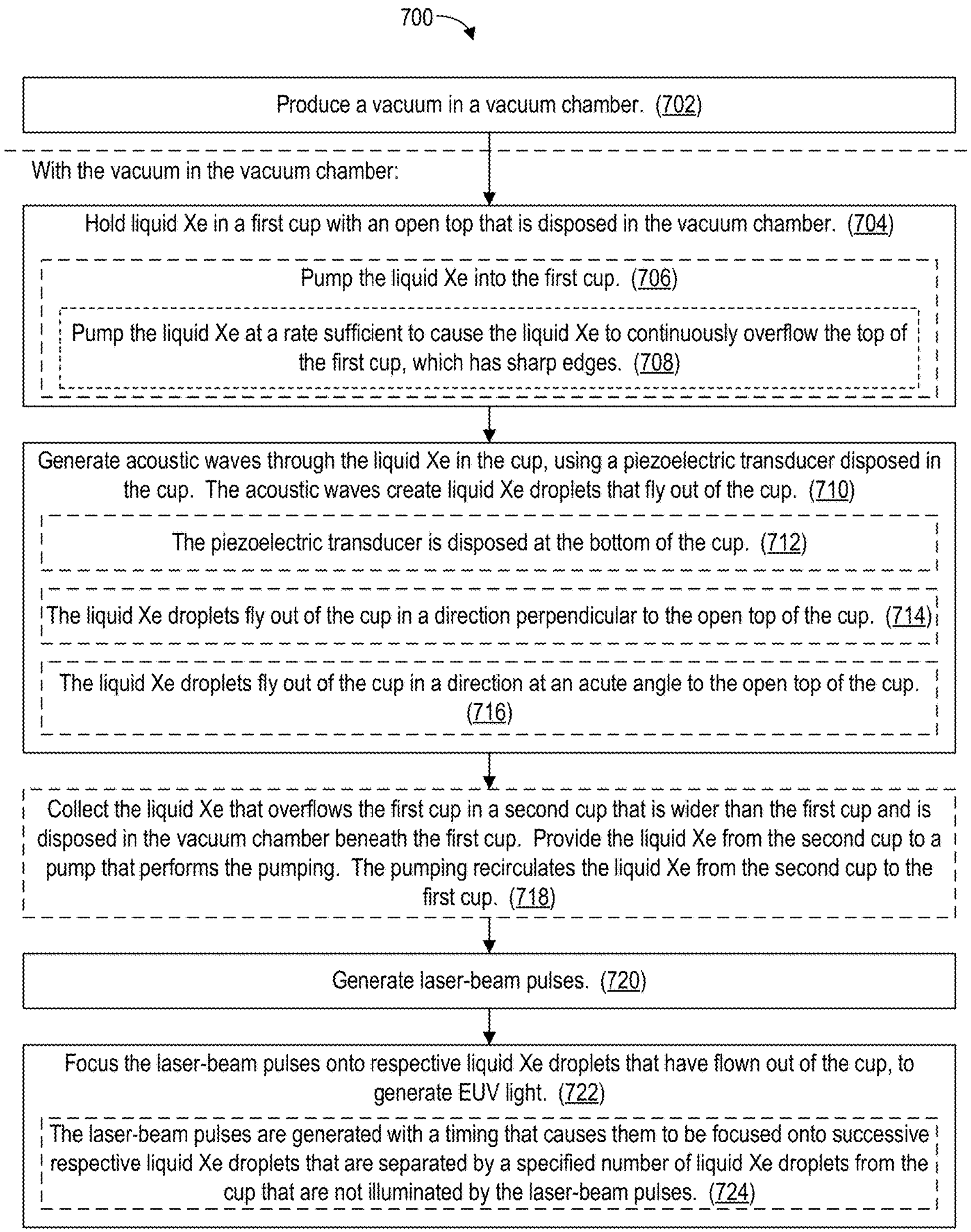
FIG. 7 is a flowchart showing a method of generating EUV light in accordance with some embodiments.

FIG. 7 is a flowchart showing a method 700 of generating EUV light in accordance with some embodiments. The method 700 may be performed in the EUV light source 100 (FIGS. 1A-1C), 200 (FIG. 2), 300 (FIG. 3), 400 (FIG. 4), 500 (FIG. 5), and/or 600 (FIG. 6).

In the method 700, a vacuum is provided (702) in a vacuum chamber (e.g., vacuum chamber 102, FIGS. 1A-5; vacuum chamber 602, FIG. 6). Subsequent steps in the method 700 are performed with the vacuum in the vacuum chamber (i.e., with the vacuum having been produced and while the vacuum is being maintained).

Liquid Xe (e.g., liquid Xe 110, FIGS. 1A-6) is held (704) in a first cup (e.g., cup 104, FIGS. 1A-4 & 6; cup 502, FIG. 5) with an open top (e.g., open top 106, FIGS. 1A-6) that is disposed in the vacuum chamber. In some embodiments, the liquid Xe is pumped (706) into the first cup (e.g., by the pump 204 through the tube 202, FIGS. 2-3). For example, the liquid Xe is pumped (708) at a rate sufficient to cause the liquid Xe to continuously overflow the top of the first cup, which has sharp edges (e.g., edges 108, FIGS. 1A-6).

Acoustic waves (e.g., acoustic waves 114, FIGS. 1A-6) are generated (710) through the liquid Xe in the cup, using a piezoelectric transducer (e.g., piezoelectric transducer 112, FIGS. 1A-6) disposed in the cup. The acoustic waves create liquid Xe droplets (e.g., droplets 116, FIGS. 1A-6) that fly out of the cup. The piezoelectric transducer may be disposed (712) at the bottom of the cup. The liquid Xe droplets may fly out of the cup (714) in a direction perpendicular to the open top of the cup (e.g., as shown in FIGS. 1A-3), or may fly out of the cup (716) in a direction at an acute angle to the open top of the cup (e.g., as shown in FIGS. 4 and 5).

In some embodiments, the liquid Xe that overflows the first cup in step 708 is collected (718) in a second cup (e.g., second cup 302, FIG. 3) that is wider than the first cup and is disposed in the vacuum chamber beneath the first cup. The liquid Xe is provided from the second cup to the pump (e.g., through the second tube 304 to the pump 204, FIG. 3) that performs the pumping. The pumping recirculates the liquid Xe from the second cup to the first cup.

Laser-beam pulses (e.g., laser-beam pulses 124, FIGS. 1A-6) are generated (720) (e.g., by the laser 118, FIGS. 1A-6). The laser-beam pulses are focused (722) (e.g., by the objective 120, FIGS. 1A-6) onto respective liquid Xe droplets that have flown out of the cup, to generate EUV light. In some embodiments, the laser-beam pulses are generated (724) with a timing that causes them to be focused onto successive respective liquid Xe droplets (e.g., onto droplets 116-1 and 116-6, FIGS. 1B-1C) that are separated by a specified number of liquid Xe droplets from the cup that are not illuminated by the laser-beam pulses (e.g., by droplets 116-2 through 116-5, FIG. 1B).

The steps of the method 700 are shown as being performed in a particular order. In practice, however, steps 704-722 are performed in an overlapping, ongoing manner.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An apparatus, comprising:
a vacuum chamber;
a cup, disposed in the vacuum chamber, to hold liquid Xenon (Xe), the cup having an open top; and
a piezoelectric transducer, disposed in the cup, to generate acoustic waves through the liquid Xe in the cup;
wherein the acoustic waves are to create liquid Xe droplets that fly out of the cup.

2. The apparatus of claim 1, wherein the piezoelectric transducer is disposed at the bottom of the cup.

3. The apparatus of claim 1, further comprising:
a pump to pump the liquid Xe into the cup; and
a tube coupled between the pump and the cup, to provide the liquid Xe from the pump to the cup.

4. The apparatus of claim 3, wherein the pump is disposed outside of the vacuum chamber.

5. The apparatus of claim 3, wherein:
the top of the cup has sharp edges; and
the pump is configured to provide the liquid Xe to the cup at a rate sufficient to cause the liquid Xe to continuously overflow the top of the cup.

6. The apparatus of claim 5, wherein the cup is a first cup and the tube is a first tube, the apparatus further comprising:
a second cup, wider than the first cup and disposed in the vacuum chamber beneath the first cup, to collect the liquid Xe that overflows the first cup; and
a second tube coupled between the pump and the second cup, to provide the liquid Xe from the second cup to the pump to recirculate the liquid Xe from the second cup to the first cup.

7. The apparatus of claim 1, wherein the piezoelectric transducer has variable timing to provide control of a direction in which the liquid Xe droplets fly out of the cup.

8. The apparatus of claim 1, wherein:
the cup comprises a first wall or first wall portion and further comprises a second wall or second wall portion; and
the first wall or first wall portion is higher than the second wall or second wall portion.

9. The apparatus of claim 1, further comprising:
a laser to generate laser-beam pulses; and
optics to focus the laser-beam pulses onto respective liquid Xe droplets that have flown out of the cup, to generate extreme ultraviolet (EUV) light.

10. The apparatus of claim 9, wherein the laser is to generate the laser-beam pulses with a timing to cause successive respective liquid Xe droplets onto which the laser-beam pulses are to be focused to be separated by a specified number of liquid Xe droplets from the cup that are not to be illuminated by the laser-beam pulses.

11. The apparatus of claim 9, wherein:
the vacuum chamber comprises one or more baffles that separate a first vacuum zone from a second vacuum zone;
the cup is disposed in the second vacuum zone;
the one or more baffles have an aperture through which the liquid Xe droplets are to pass; and
the optics are to focus the laser-beam pulses onto the respective liquid Xe droplets in the first vacuum zone.

12. A method, comprising:
producing a vacuum in a vacuum chamber;
with the vacuum in the vacuum chamber, holding liquid Xenon (Xe) in a cup with an open top, the cup being disposed in the vacuum chamber; and
with the vacuum in the vacuum chamber, generating acoustic waves through the liquid Xe in the cup, using a piezoelectric transducer disposed in the cup;
wherein the acoustic waves create liquid Xe droplets that fly out of the cup.

13. The method of claim 12, wherein the piezoelectric transducer is disposed at the bottom of the cup.

14. The method of claim 12, wherein holding the liquid Xe in the cup comprises pumping the liquid Xe into the cup.

15. The method of claim 14, wherein:
the top of the cup has sharp edges; and
the pumping is performed at a rate sufficient to cause the liquid Xe to continuously overflow the top of the cup.

16. The method of claim 15, wherein the cup is a first cup, the method further comprising, with the vacuum in the vacuum chamber:
collecting the liquid Xe that overflows the first cup in a second cup that is wider than the first cup and is disposed in the vacuum chamber beneath the first cup; and
providing the liquid Xe from the second cup to a pump that performs the pumping;
wherein the pumping comprises recirculating the liquid Xe from the second cup to the first cup.

17. The method of claim 12, wherein generating the acoustic waves causes the liquid Xe droplets to fly out of the cup in a direction perpendicular to the open top of the cup.

18. The method of claim 12, wherein generating the acoustic waves causes the liquid Xe droplets to fly out of the cup in a direction at an acute angle to the open top of the cup.

19. The method of claim 12, further comprising, with the vacuum in the vacuum chamber:
generating laser-beam pulses; and
focusing the laser-beam pulses onto respective liquid Xe droplets that have flown out of the cup, to generate extreme ultraviolet (EUV) light.

20. The method of claim 19, wherein generating the laser-beam pulses is performed with a timing that causes the laser-beam pulses to be focused onto successive respective liquid Xe droplets that are separated by a specified number of liquid Xe droplets from the cup that are not illuminated by the laser-beam pulses.

* * * * *